United States Patent
Jain

(10) Patent No.: US 7,280,993 B2
(45) Date of Patent: Oct. 9, 2007

(54) REACHABILITY-BASED VERIFICATION OF A CIRCUIT USING ONE OR MORE MULTIPLY ROOTED BINARY DECISION DIAGRAMS

(75) Inventor: Jawahar Jain, Santa Clara, CA (US)

(73) Assignee: Fujitsu Limited, Kawasaki (JP)

( * ) Notice: Subject to any disclaimer, the term of this patent is extended or adjusted under 35 U.S.C. 154(b) by 319 days.

(21) Appl. No.: 10/704,518

(22) Filed: Nov. 7, 2003

(65) Prior Publication Data

US 2004/0098682 A1    May 20, 2004

Related U.S. Application Data

(60) Provisional application No. 60/426,207, filed on Nov. 13, 2002.

(51) Int. Cl.
*G06F 17/00* (2006.01)
*G06N 5/02* (2006.01)

(52) U.S. Cl. .............................. 706/47; 706/46; 706/45

(58) Field of Classification Search ................ 364/400; 706/47, 46, 45; 716/5
See application file for complete search history.

(56) References Cited

U.S. PATENT DOCUMENTS 5,243,538 A * 9/1993 Okuzawa et al. ............... 716/5

OTHER PUBLICATIONS

John Lafferty, Ordered Binary Decision Diagrams and Minimal Trellises, Sep. 1999, IEEE, vol. 48, No. 9, pp. 971-973.*

* cited by examiner

*Primary Examiner*—Joseph P Hirl
(74) *Attorney, Agent, or Firm*—Baker Botts L.L.P.

(57) ABSTRACT

In one embodiment, a method for reachability-based verification of a circuit using one or more multiply rooted binary decision diagrams (BDDs) includes generating a partitioned ordered BDD (POBDD) for one or more latches in the circuit and, for each POBDD, graphing a transition relation (TR) associated with the POBDD that reflects a plurality of input and state variables for the POBDD, generating two disjunctive partitions of the POBDD, comparing the two disjunctive partitions with a threshold, if the two disjunctive partitions are below the threshold, assigning the POBDD to the root of a noncube-based partitioning tree (NCPT) that comprises a plurality of leaves, and, for each leaf of the NCPT, composing one or more decomposition points and generating one or more partitions z. The method includes using each partition of the TR, performing a reachability-based analysis until one or more fixed points are reached.

25 Claims, 2 Drawing Sheets

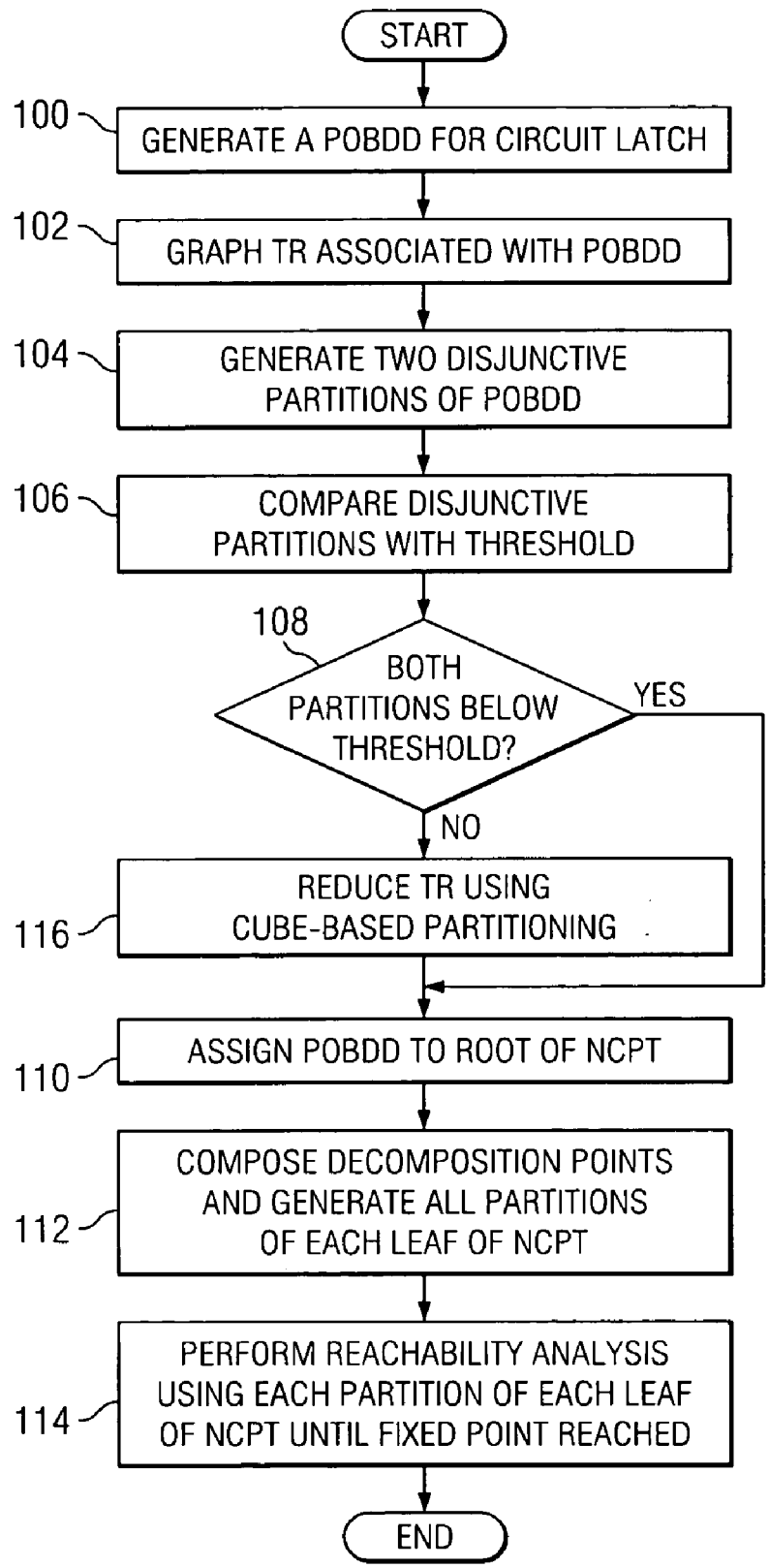

REACHABILITY-BASED VERIFICATION OF A CIRCUIT USING ONE OR MORE MULTIPLY ROOTED BINARY DECISION DIAGRAMS

RELATED APPLICATION

This application claims the benefit, under 35 U.S.C. §119(e), of U.S. Provisional Patent Application No. 60/426,207, filed Nov. 13, 2002, which is incorporated herein by reference.

TECHNICAL FIELD OF THE INVENTION

This invention relates in general to the field of circuit verification and more particularly to reachability-based verification of a circuit using one or more multiply rooted binary decision diagrams.

BACKGROUND OF THE INVENTION

The proliferation of integrated circuits (ICs) has placed increasing demands on the design of digital systems included in many devices, components, and architectures. The number of digital systems that include ICs continues to steadily increase and may be driven by a wide array of products and systems. Added functionalities may be implemented in ICs in order to execute additional tasks or to effectuate more sophisticated operations in their respective applications or environments. Additionally, system parameters of ICs may dictate that their operations be performed in an optimal time interval, which allows for even more operations to be accommodated in a given clock cycle. These rigorous demands associated with production and design generally result in the need for more advanced and complex verification processes and procedures.

Verification techniques are generally implemented in order to ensure that an IC or a digital element is capable of performing its intended functionality. In other cases, verification techniques may be used in order to ascertain whether a selected characteristic, behavior, or property is present in a given target circuit. Flaws or inaccuracies in an IC or a digital element may inhibit system functionality and/or cause significant operational problems in a corresponding architecture.

SUMMARY OF THE INVENTION

Particular embodiments of the present invention may reduce or eliminate disadvantages and problems traditionally associated with circuit verification.

In one embodiment of the present invention, a method for reachability-based verification of a circuit using one or more multiply rooted binary decision diagrams (BDDs) includes generating a partitioned ordered BDD (POBDD) for one or more latches in the circuit and, for each POBDD, graphing a transition relation (TR) associated with the POBDD that reflects a plurality of input and state variables for the POBDD, generating two disjunctive partitions of the POBDD, comparing the two disjunctive partitions with a threshold, if the two disjunctive partitions are below the threshold, assigning the POBDD to the root of a noncube-based partitioning tree (NCPT) that comprises a plurality of leaves, and, for each leaf of the NCPT, composing one or more decomposition points and generating one or more partitionsz. The method includes using each partition of the TR, performing a reachability-based analysis until one or more fixed points are reached.

Particular embodiments of the present invention may provide one or more technical advantages. In particular embodiments, a reachability-based analysis is performed using a compact form POBDDs that are noncube-based and overlapping. In particular embodiments, a reachability-based analysis is performed using more general data structures than cube-based POBDDs. Particular embodiments reduce memory requirements associated with a reachability-based analysis. Particular embodiments reduce BDD size exponentially over cube-based POBDDs. Particular embodiments provide an efficient form of POBDD. Particular embodiments facilitate combinational verification. Particular embodiments facilitate verification of sequential circuits.

Certain embodiments may provide all, some, or none of these technical advantages. Certain embodiments may provide one or more other technical advantages, one or more of which may be readily apparent to those skilled in the art from the figures, descriptions, and claims herein.

BRIEF DESCRIPTION OF THE DRAWINGS

To provide a more complete understanding of the present invention and the features and advantages thereof, reference is made to the following description, taken in conjunction with the accompanying drawings, in which:

FIG. 3 illustrates an example method for semiformal verification of a circuit using a scheduling technique.

DETAILED DESCRIPTION OF EXAMPLE EMBODIMENTS

Figure 1:
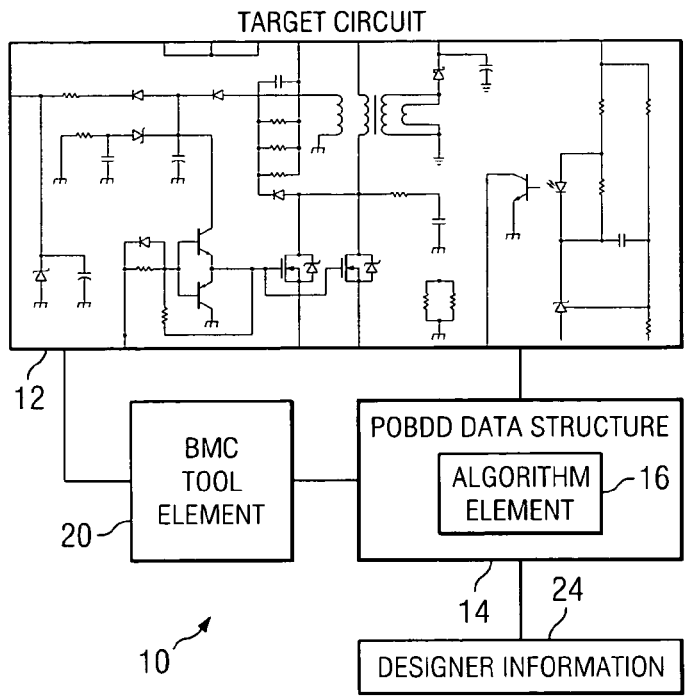
FIG. 1 illustrates an example system for determining one or more reachable states in a circuit using one or more partitioned data structures.

FIG. 1 illustrates an example system 10 for determining one or more reachable states in a circuit (such as target circuit 12) using one or more partitioned data structures. System 10 may include a partitioned ordered binary decision diagram (POBDD) data structure 14 that includes an algorithm element 16. Additionally, system 10 may include a bounded model checking (BMC) tool element 20 and a segment of designer information 24 that may be communicated to POBDD data structure 14. System 10 may generally be positioned within, or otherwise operate in conjunction with, any integrated circuit, digital element, processing configurations, or binary architecture in which verification procedures or processes may be implemented. Additionally, system 10 may be provided in cooperation with any device, component, hardware, software, object, or element associated with digital processing of information or data.

System 10 operates to provide a verification process capable of reaching significant depths in sub-spaces of target circuit 12. By using POBDD data structure 14 and an analysis that involves imaging and preimaging operations, selected states that are provenly deep may be identified. These states may then be represented in a BDD format and then mapped as a conjunctive normal form (CNF) formula. The CNF formula may then be provided to BMC tool element 20 as a set of starting states from which to begin an enhanced verification analysis. BMC tool element 20 may then execute bounded model checking operations using these starting states (instead of initiating its operations from a single state) in order to effectuate a verification procedure associated with target circuit 12. A single state generally represents an initial state that is predominantly shallow. By providing starting states that are already deep, BMC tool element 20 achieves enhanced verification results because it may reach deeper into target circuit 12. In addition, the initial deep states may be obtained using POBDD data structure 14 in an optimal time interval, which in turn results in a significant advance in efficacy for the verification procedure.

System 10 provides a verification architecture that is significantly faster than other verification or simulation techniques. This may be due, in part, to the integration of several verification approaches that may be combined in order to enhance a starting point associated with bounded model checking operations. In certain embodiments, such a verification approach may be particularly beneficial for elements that have a large sequential depth.

System 10 may also extend reachability parameters associated with target circuit 12. New or unexplored deep states within target circuit 12 may be uncovered using system 10. System 10 may allow verification to be executed deep into circuits. System 10 may achieve a significant reduction in latency associated with the verification process. Depth may be an exact depth or the approximate depth depending on what the user wants. The approximate depth is only an upper bound on the actual depth. To calculate the depth of the states, the following operation may be implemented. Assume the user is starting from set of states s_0 and assume given windows w, w' where w' is a complement of w). Referring to s_0 as a BASE-set, the following operations may be executed:

1. image on BASE-set (under window w) and get s_1;
2. pre-image on s_1 in window w' and get pre-s_1(w');
3. image on pre-s_1(w') (under window w) and get s_1';
4. calculate s_1"=s_1−s_1' s_1" reflecting the set of states in window w that cannot be reached from outside the window. s_1" becomes now our starting point (BASE-set) to calculate states of even greater depth.

In general, steps 1-4 can be suitably repeated, giving states with greater and greater depth. This takes into consideration states that are of a given depth as calculated from within the window w. It can be suitably modified, where appropriate, to include states whose depth is some minimum "d" where the path of length "d" criss-crosses from one window to another. This can be achieved by keeping a set whose depth is updated during each step of image/pre-image. There can be numerous ways of keeping a running count of depth of some states. A simple way to do this calculation can be seen if the reachability is done in a breadth-first manner. To each partition w_1, . . . , w_k the above procedure may be applied and then a calculation may be executed reflecting the actual depth of a state even if it is obtained by a criss-cross path starting form initial state.

Target circuit 12 is an electronic or digital object sought to be tested in order to verify that it operates according to its prescribed or intended functionality. The integrity, validity, or design specifications of a sub-space within target circuit 12 may be analyzed using POBDD data structure 14. Target circuit 12 may include any associated circuitry, inclusive of logic gates, counters, inverters, buffers, or any other suitable devices, components, or objects capable of cooperating or interacting with target circuit 12. Target circuit 12 may alternatively be any other suitable device, component, architecture, arrangement, hardware, software, object or element capable of processing binary data or digital information in a verification environment. Target circuit 12 may be designed specifically to include (or be capable of performing) some property. The term "property" as used herein in this document is inclusive of any capability, characteristic, operation, action, or behavior that may be associated with target circuit 12. In operation, target circuit 12 may be verified or otherwise validated in order to ensure that it maintains its designated property or characteristic, or that it performs a prescribed operation properly.

POBDD data structure 14 is an element operable to execute partitioning of BDD elements in a binary or digital environment. POBDD data structure 14 is a representation of a Boolean function for manipulation. As referred to herein, POBDD data structure 14 may be inclusive of a partitioned reduced order binary decision diagram (PROBDD) or BDD data structures (potentially with partitioning) where appropriate. The terms PROBDD and POBDD are interchangeable and generally represented in various suitable fashions (for purposes of brevity in certain cases) in describing their applications, where appropriate. POBDD data structure 14 may receive designer information 24 and perform a preliminarily analysis on target circuit 12 in order to retrieve a first set of states based on designer information 24. The first set of states from a sampled sub-space may then be used in order to augment or otherwise enhance the capabilities of BMC tool element 20. POBDD data structure 14 may invoke one or more algorithms included in algorithm element 16 in order to evaluate a selected property associated with target circuit 12. The first set of states allows BMC tool element 20 to extend deep into target circuit 12.

POBDDs are generally canonical and, therefore, may be used for combinational equivalence checking. POBDDs may be successively applied in reachable analyses for sequential circuit verification. Reachable state sets may be represented as POBDDs. This minimizes the memory requirement by only keeping one partition in a corresponding memory during a given time interval. Additionally, fixed point computations may be performed on each partition separately using reachability algorithms, which may be included within algorithm element 16, in conjunction with POBDD protocols that are effectuated by POBDD data structure 14.

POBDD data structure 14 is generally faster than other approaches used in verification operations. Moreover, the partitioned structure of POBDD data structure 14 is compact and may provide for much easier parallelization. Additionally, POBDD data structure 14 may offer dynamic partitioning that avoids memory deterioration, which may also be referred to in certain applications as memory blowup. POBDD data structure 14 may cover a large volume of states within target circuit 12 quickly and, further, break designs into loosely coupled sets of interacting finite state machines.

In operation of an example embodiment, a designer or a manufacturer may write some program that identifies a property, characteristic, operation, or behavior that is sought to be tested or verified in target circuit 12. The property or characteristic may be suitably written in a particular syntax before it is communicated to POBDD data structure 14. The program may then be properly communicated to POBDD data structure 14, whereby POBDD data structure 14 tests the specified property in target circuit 12. POBDD data structure 14 may then generate a first set of states, represent the first set in a BDD format, and map the BDD format into a CNF formula to be forwarded to BMC tool element 20.

CNF is a conjunction of clauses, where clauses are either attribute-value conditions or disjunctions of attribute-value conditions. A Boolean expression having junctors in {AND, OR} is in conjunctive normal form if no junctors are negated and if no AND junctor is dominated by an OR junctor. For example, (color=red or color=green) and (shape=rectangular) is a formula in CNF. A Boolean formula in this form is expressed as an AND of clauses, each of which is the OR of one or more literals. The theory of CNFs may also be thought of as a conjunction of disjunctions. Each disjunction can be represented as a clause that includes positive literals and negative literals. The variables may be quantified universally. For logic programming (Prolog, Fril, etc.) it is beneficial to be able to transform sentences into statements a computer can accommodate. Logic programming statements may take the form of horn clauses that are conditional sentences with a particularly simple structure. It can be shown that every propositional logic sentence is equivalent to a sentence in conjunctive normal form.

In particular embodiments, by invoking or implementing a selected algorithm within algorithm element 14, POBDD data structure 14 may selectively explore deep into target circuit 12 without looking at an entire circuit architecture or configuration. Viewing an entire circuit element may slow the verification process significantly. Instead, algorithm element 16 may be invoked such that predetermined locations within target circuit 12 are visited in order to evaluate a small fragment of states (within sub-spaces) in a deep manner.

Algorithm element 16 is a data processing object that may include one or more algorithms that allow for a specific or designated property to be explored or verified in target circuit 12. Algorithm element 16 may be included within POBDD data structure 14 or provided external thereto in accordance with particular processing needs or arrangements. Additionally, algorithm element 16 may communicate with any other external component that provides one or more instructions or characteristics to be used in verifying sub-spaces within target circuit 12. Moreover, algorithm element 16 may directly receive designer information 24 in order to verify one or more properties associated with target circuit 12. Designer information 24 may also include or specify the type of circuit or element being subjected to the verification process. Algorithm element 16 may include any suitable hardware, software, objects, or elements operable to facilitate the verification operations being executed by POBDD data structure 14.

For purposes of example and teaching it is useful to provide a further explanation of some of the algorithms that may be used in verifying selected properties associated with sub-spaces of target circuit 12. Many operations for the manipulation of Boolean functions can be performed efficiently for functions represented by OBDDs. For example, some of the basic operations are provided by:

1. Evaluation. For an OBDD G representing f and an input a compute the value f(a).
2. Reduction. For an OBDD G compute the equivalent reduced OBDD.
3. Equivalence test. Test whether two functions represented by OBDDs are equal.
4. Satisfiability problems. Problems may include:
Satisfiability. For an OBDD G representing f find an input a for which f(a)=1 or output that no such input exists.
SAT-Count. For an OBDD G representing f, compute the number of inputs a for which f(a)=1.
5. Synthesis (also referred to as apply). For functions f and g represented by an OBDD G include into G a representation for f$\bar{x}$g where $\bar{x}$ is a binary Boolean operation (e.g., $\Lambda$).
6. Replacements (also called Substitution).
Replacement by constants. For a function f represented by an OBDD, for a variable $x_i$ and a constant $c \in \{0, 1\}$ compute an OBDD for $f_{|xi=c}$.
Replacement by functions. For functions f and g represented by an OBDD and for a variable $x_i$ compute an OBDD for $f_{|xi=g}$.
7. Universal quantification and existential quantification. For a function f represented by an OBDD and for a variable $x_i$ compute an OBDD for $(\forall x_i:f):=f_{|xi=0} \Lambda f_{|xi=1}$ or $(\exists x_i:f):= f_{|xi=0} \vee f_{|xi=1}$, respectively.

In OBDD packages the operation reduction is usually integrated into the other operations such that only reduced OBDDs are represented. Many applications of OBDDs concern functions given as circuits. Hence, one important operation is the computation of an OBDD for a function given by a circuit, which is usually performed by the symbolic simulation of the circuit. This means that OBDDs for the functions representing the input variables are constructed. This may be easy because an OBDD for the function $x_i$ merely consists of a node labeled by $x_i$ with the 0-sink as 0-successor and the 1-sink as 1-successor. The circuit may be evaluated in some topological order (each gate is considered after all its predecessors have been considered) and a computation is made for each gate. The computation is a representation of the function at its output by combining the OBDDs representing the functions at its input using the synthesis operation.

Another possibility is that a given circuit is built of larger blocks. In such a case, OBDDs may be computed for the functions computed by each block and combine the OBDDs with the operation replacement by functions. In the case of computed OBDDs, for the functions represented by two circuits, the equivalence operation for OBDDs may be applied in order to test the circuits for equivalence.

In applications such as Boolean matching, signatures for the considered functions may be computed. A signature is a property of a function that can be computed efficiently and that is likely to be different for different functions. Signatures can be used to detect that given functions are different. A very simple signature is the number of satisfying inputs of a function. The operation SAT-count may be applied in order to compute this and other signatures where appropriate.

BMC tool element 20 is a component operable to execute bounded model checking operations on target circuit 12. BMC tool element 20 may receive information from POBDD data structure 14 and use that information in order to execute verification techniques on target circuit 12. BMC tool element 20 may use semi-formal verification approaches and be further enhanced by using a first set of states provided by POBDD data structure 14. BMC tool element 20 may employ SAT techniques to execute proper bounded model checking. In bounded model checking, a Boolean formula is constructed that is satisfiable if the underlying state transition system can realize a finite sequence of state transitions that reaches certain states of interest. BMC tool element 20 may include any suitable device, component, hardware, software, object, or element operable to execute one or more bounded model checking processes or operations such that selected sub-spaces of target circuit 12 may be verified or validated.

BMC tool element 20 may also be appropriately modified such that it can utilize a first set of states instead of a single initial state. This may allow system 10 to reach provenly deep sub-spaces within target circuit 12. Accordingly, the capacity of the program within BMC tool element 20 is effectively enhanced in order to improve the verification process. After the BMC program is executed, it may be determined that neighboring segments have been exhaustively explored such that an adequate sampling of target circuit 12 has been effectuated. The decision of whether to continue sampling sub-spaces of target circuit 12 may rest with an end user or controlled by the BMC program characteristics.

For purposes of teaching and example, some of the principles and concepts associated with POBDD, PROBDD, and BDD operations are provided below. The proffered description is only being provided to assist in the understanding of some of the complex theorems associated with partitioned BDD technology. The description should not be construed to limit any of the operations of any of the elements of system 10. It is imperative to recognize that the following description is for purposes of example only and should not be interpreted to restrict any other suitable operations that may be executed by POBDD data structure 14 or any other element involved in partitioning operations or the verification process.

In order to describe partitioned ROBDDs, it is useful to consider the following example. Assume a Boolean function $f:B^n \to B$ defined over n inputs $X_n = \{x_1, \ldots, x_n\}$. The partitioned-ROBDD representation $X_f$ of f is defined as follows:

Given a Boolean function: $f:B^n \to B$ defined over $X_n$, a partitioned-ROBDD representation $X_f$ of f is a set of k function pairs, $\chi_f = \{(\omega_1, \bar{f}_1), \ldots, (\omega_k, \bar{f}_k)\}$ where, $(\omega_i, B^n \to B$ and $\bar{f}_i : B^n \to B$, for $1 \leq i \leq k$, are also defined over $X_n$ and satisfy the following conditions:

1. $w_i$ and $\bar{f}_i$ are represented as ROBDDs with the variable ordering $\pi_i$, for $1 \leq i \leq k$.
2. $w_1 + w_2 + \ldots + w_k = 1$
3. $\bar{f}_i = w_i \wedge f$, for $1 \leq i \leq k$ In the example provided, + and $\wedge$ represent Boolean OR and AND respectively. The set $\{w_1, \ldots, W_k\}$ is denoted by W.

Each $w_i$ may be referred to as a window function. Intuitively, a window function $w_i$ may represent a part of the Boolean space over which f is defined. Every pair $(w_j, \bar{f}_j)$ may represent a partition of the function f. In the example, the term "partition" is not being used in the sense where partitions have to be disjoint. If, in addition to conditions 1-3 (provided above), $w_i \wedge w_j = 0$ for $i \neq j$, then the partitions may be orthogonal. Each $(w_j, \bar{f}_j)$ may now be considered a partition in a conventional sense.

In constructing partitioned ROBDDs, the performance of partitioned ROBDDs generally depends on the ability to generate effective partitions of the Boolean space over which the function can be compactly represented. The issue of finding adequate partitions of the Boolean space is central to the partitioned-ROBDD representation. Described herein are example heuristics, which may be effective in generating compact, orthogonally partitioned-ROBDDs. Although a Boolean netlist is used in the present approach, the techniques described are general and may be applied or extended to any arbitrary sequence of Boolean operations.

In an example BDD partitioning approach, the number of windows may be decided either a priori or dynamically. After a window $w_i$ is decided, a partitioned-ROBDD corresponding to it may be obtained by composing F in the Boolean space corresponding to the window $w_i$. In partitioning, the BDD for some function F, a decomposed BDD representation (i.e., a BDD which is not in terms of input variables but in terms of some pseudo-input variables that are created in the process of building BDDs for the given target function F) is considered. To create the partitioned BDD for F, its corresponding decomposed BDD may be analyzed to yield the partitions. The partition decision may be typically taken because the decomposed BDD for F in terms of its decomposition points, $\Psi_1, \ldots, \Psi_k$ cannot be composed. Note, the partitioned BDD for F, from its decomposed BDD, may be created in following three ways:

(1) Partition using input variables. The number of input variables may be changed dynamically or can be set to a predetermined constant.

(2) Partition using "internal" variables, i.e., variables that are not input variables. Such variables can be pseudo-variables introduced at internal gates.

(3) Partition using a suitable combination of 1 and 2.

At any given point in time in the present filtering based verification process a decomposed representation may be reflected by, $f_d(\Psi, X)$, of F where $\Psi = \{\psi_1, \ldots, \psi_k\}$ is called a decomposition set and it corresponds to the internal cut set selected, typically, by the naive cut or the smart cut process, and each $\psi_i \in \Psi$. is a decomposition point. Let $\Psi_{bdd} = \{\psi_{1_{bdd}}, \ldots, \psi_{k_{bdd}}\}$ represent the array containing the ROBDDs of the decomposition points, i.e., each $\psi_1 \in \Psi$. has a corresponding ROBDD, $\psi_{i_{bdd}} \in \Psi_{bdd}$, in terms of primary input variables as well as (possibly) other $.\psi_j \in \Psi.$, where $\psi_j \neq \psi_i$. Similarly, the array of $\psi_{i_{bdd}w_i}$ may be represented by $\Psi_{i_{bdd}w_i}$. The composition [?] of $.\psi_i$ in $f_d(\Psi, X)$ may be denoted by $f_d(\Psi, X) \cdot (\Psi_i \leftarrow \psi_{i_{bdd}})$, where, $$f_d(\Psi,X) \cdot (\psi_i \leftarrow \psi_{i_{bdd}}) = \overline{\psi_{i_{bdd}}} \cdot f_{d\overline{\psi_i}} + \psi_{i_{bdd}} \cdot f_{d''\psi_i} \qquad (1)$$

The vector composition of the $\Psi$ in $f_d(\Psi, X)$ may be denoted by $f_d(\psi, X) \cdot (\psi \leftarrow \psi_{bdd})$ and may represent a successive composition of $\psi_i$'s into $f_d$.

In considering partitioning of a decomposed representation, given a window function $w_i$, a decomposed representation $f_d(\Psi, X)$, and the ROBDD array $\Psi_{bdd}$ of f, $f_i$ is sought such that the ROBDD representing $f_i = w_i \wedge f_i$ is smaller than f. It can be shown that all $w_i$, which may be nothing but cubes, may satisfy this requirement.

Given $f_d$, $\Psi_{bdd}$, and $w_i$s, the cofactors $\Psi_{w_i}$ and $f_{d_{w_i}}$ may be created. By composing $\psi_{bdd_{w_i}}$, in $F_{dw_i}$, the partition function $f_i = f_{w_i} f_i = f_{wi}$ may be achieved. Thus, given a set of window functions $w_i$, the partitioned-ROBDD $x_f$ of f may be given by $\chi_f = \{(w_i, w_i \wedge f_{wi}) | 1 \leq i \leq k\}$. It is generally easy to check that the above definition satisfies all the conditions of Definition 1.

If $w_i$ is a cube, $f_i$ has a smaller size than the ROBDD for f. Also, the ROBDD representing $w_i$ has k internal nodes where k is the number of literals in $w_i$. Because $w_i$ and $f_{wi}$ have disjoint support, $|\bar{f}_i| = |w_i \wedge f_i| = (k + |f_i|) \approx |f_i|$. Also, because each intermediate result of building $f_i$ will be smaller than that of building f, the intermediate peak memory requirement is also reduced. This may not be true in the presence of dynamic variable reordering when f and $f_i$ can have different variable orderings. In practice, because dynamic variable reordering operates on smaller graphs in the case of partitioning, it is even more effective.

When the window function is a more complex function of PIs than a cube, $f_i = f_{w_i}$ may be used. $f_{w_i}$ is the generalized cofactor of f on $w_i$. The generalized cofactor of f on $w_i$ is generally much smaller than f. But in the example case provided, the size of the $i^{th}$ partitioned-ROBDD $|\bar{f}_i|$ can be $O(|w_i||f_i|)$ in the worse case. To avoid this, while using general window functions, $w_i$s may be used, which is generally small.

With regards to the selection of window functions, after deciding how to construct the partition function from a given window function, methods to obtain appropriate window functions may be evaluated. The methods may be divided into two categories: a priori selection and "explosion" based selection.

In a priori partitioning, a predetermined number of primary inputs (PIs) is selected to partition. If it is decided to partition on 'k' PIs, then $2^k$ partitions are created that correspond to all the binary assignments of these variables. For example, if it is decided to partition on $x_1$ and $x_2$, four partitions may be created: $x_1 x_2, x_1 \overline{x_2}, \overline{x_1} x_2$ and $\overline{x_1 x_2}$. For a given window function of this type, partitioned-ROBDDs can be created, which are guaranteed to be smaller than the monolithic ROBDD. Because only one partition needs to be in the memory at a given time, success is highly likely in the selected space. The reduction in memory is large and may be accompanied by an overall reduction in the time taken to process all partitions as well.

Variables should be selected that maximize the partitioning achieved while minimizing the redundancy that may arise in creating different partitions independently. This reflects a fundamental principle of many divide and conquer approaches. The cost of partitioning a function f on variable x may be defined as:

$$\cos t_x(f) = \alpha[p_x(f)] + \beta[r_x(f)] \quad (2)$$

where $p_x(f)$ represents the partitioning factor and is given by, $$p_x(f) = \max\left(\frac{|f_x|}{|f|}, \frac{f_{\bar{x}}}{f}\right) \quad (3)$$

and $r_x(f)$ represents the redundancy factor and is given by, $$r_x(f) = \max\left(\frac{|f_x + f_{\bar{x}}|}{|f|}\right) \quad (4)$$

A lower partitioning factor may be beneficial as it implies that the worst of the two partitions is small and similarly a lower redundancy factor is beneficial because it implies that the total work involved in creating the two partitions is less. The variable x that has the lower overall cost is chosen for partitioning.

For a given vector of functions F and a variable x, the cost of partitioning may be defined as:

$$cost_x(F) = \sum_{i=1}^{k} cost_x(f_i)$$

The PIs may be numbered in increasing order of their cost of partitioning $f_d$ and $\Psi$ and the best 'k' (where 'k' is a predetermined number specified by the user) may also be selected. Using a similar cost function, PI variables may be selected as well as pseudo-variables, such as a.$\psi_{i_{bdd}}$ expressed in terms of PIs, to create partitioned-ROBDDs. In the example case, the cofactor operations may become generalized cofactor operations for window functions that are non-cubes. This type of selection, where all the PIs are ranked according to their cost of partitioning $f_d$ and $\Psi$, is called a static partition selection.

Alternatively, a dynamic partitioning strategy may be used in which the best PI (e.g. x) is selected based on $f_d$ and $\Psi$ and then the subsequent PIs are recursively selected based on $f_{d_x}$ and $\Psi_x$ in one partition and in $f_{d_{\bar{x}}}$ and $\Psi_{\bar{x}}$ in the other partition. The dynamic partitioning method may require an exponential number of cofactors and can be cost-prohibitive in certain circumstances. The cost can be somewhat reduced by exploiting the fact that the only values that are of interest are the sizes of the cofactors of $f_d$ and $\psi_{i_{bdd}}$s. An upper bound on the value of $|f_{d_x}|$ can be calculated by traversing the ROBDD of $f_d$ and taking the x=1 branch whenever the node with variable id corresponding to x is encountered. The method does not give the exact count as the BDD obtained by traversing the ROBDD in this manner is not reduced. One advantage of such an implementation is that no new nodes need to be created and the traversal is relatively quick.

Partitions may be created such that the number of partitions are chosen dynamically. In one case, each time the BDDs blow-up, partitioning is executed dynamically using splitting variables, chosen in the increment of 1, until the BDD blow-up is deemed to be circumvented.

In explosion based partitioning, the $\psi_{i_{bdd}}$s in $f_d$ is successively composed. If the graph size increases significantly for some composition (e.g. $\Psi_j$), a window function may be selected (e.g. w) based on the current $f_d$ and $\psi_{j_{bdd}}$. The window functions may be either a PI and its complement or some $\psi_{k_{bdd}}$ and its complement that is expressed in terms of PIs only and that has a small size.

Once the window function w is obtained, two partitions (w$\wedge f_{d_w}, \psi_w$), and ($\overline{w} \wedge f_{d_w}, \psi_{\overline{w}}$) may be created and the routine on each of the partitions may be recursively recalled. In general, if the resulting BDD after composition is more than ten times larger then the sum of all the previous decomposed BDDs that have already been composed and the size of original decomposed BDD, explosion based partitioning may be executed.

In a priori variable selection, as well as explosion based partitioning, a fixed number of splitting variables is determined. Explosion based partitioning followed by a fixed number of primary input variables based partitioning (or a vice-versa process) may then be executed. The explosion based partitioning can use both the primary inputs as well as pseudo-variables/decomposition points.

After selecting a window function and creating the decomposed representation for the $i^{th}$ partition given by $f_{d_w^i}$ and $\psi_{w_i}$, the final step is to compose $\psi_{w_i}$ in $f_{d_w^i}$, i.e., $f_{d_w^i}(\psi, X)$ ($\psi \leftarrow \psi_{bdd_w^i}$). Although, the final ROBDD size is constant for a given variable ordering, the intermediate memory requirement and the time for composition may be a strong function of the order in which the decomposition points are composed. For candidate variables that can be composed into $f_d$, a cost can be assigned that estimates the size of the resulting composed ROBDD. The variable with the lowest cost estimate may be composed. A decomposition variable may be chosen that leads to the smallest increase in the size of the support set of the ROBDD after composition. At each step, candidate $\psi_s$ may be restricted for composition to those decomposition points that are not present in any of the other $\psi_{bdd}$s. This may ensure that a decomposition variable needs to be composed only once in $f_d$.

Figure 2:
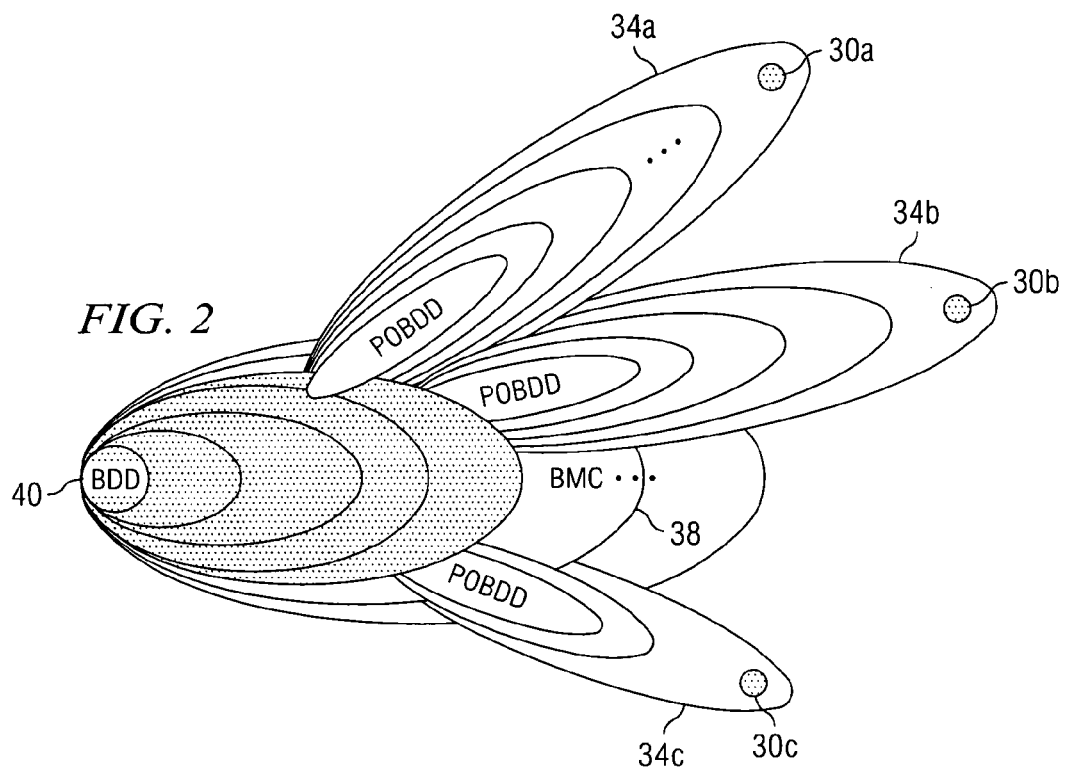
FIG. 2 illustrates example interaction of elements of the system illustrated in FIG. 1.

FIG. 2 illustrates example interaction of elements of the system illustrated in FIG. 1. FIG. 2 illustrates a set of starting points 30a-c, a set of POBDD elements 34a-c, a BMC element 38, and a BDD element 40. These elements are abstractly represented and are intended to reflect general principles associated with system 10. POBDD techniques may be employed and an analysis, which may include imaging/preimaging operations, may be executed in order to determine a first set of states that are provenly deep and that are communicated to BMC tool element 20. POBDD techniques may refer to any operation that may be executed on a data structure in order to convert it into a canonical form. Partitioned refers to the fact that the Boolean space is being broken into different sub-spaces.

For purposes of teaching, it is helpful to explain some of the imaging and preimaging operations that are executed in conjunction with POBDD techniques. Functions generally map one domain to a co-domain. Variables may be represented in terms of X and outputs may be represented in terms of Y. Each combination of X may result in some representation of Y. For each combination of X, there may be a unique combination that results and this may define the function. An image is what is produced as a result of certain operations associated with the function. An operation may be applied on the domain and what results is an image. For example, a number of states may be present and from those states many other states may be reached. From ten states, a thousand states may be reached within target circuit 12. The thousand states may be considered as reflecting an image associated with the ten states.

The image operation may be considered as a prism or a mirror that provides some reflection in order to project the corresponding image. For a given image, an object and a mirror are employed to derive the image. The object may be referred to as the starting ten states, whereby the mirror is the operation and the thousand states is the image set. In a similar fashion, preimaging operations may be defined. The preimage in the example provided may be represented by the one thousand states. The operation is still represented by the mirror and an object may be derived using these two variables. Thus, in the case of images, an object and a mirror are present and the reflection is sought. In the case of preimaging, the reflection and the mirror are present and what is being sought is the original object that projected the image.

The image operation in the case of a states-based analysis may be referred to as a transition/relation operation. The transition/relation operation may link the transitions that are possible in a given state space, where there are certain rules that prohibit moving from state one to state ten because links are not present. The transitions that are possible and impossible may then be captured. Thus, the mirror (transition/relation operation) may indicate what transitions are possible in the system/circuit/state.

There are only some states that may be accessed after one application of a transition/relation operation. Accordingly, after applying the transition/relation operation, movement may be effectuated from that point to a greater depth. Similarly, from state one thousand, it may be determined the values of the original states using the transition/relation operation. Accordingly, a preimage may be achieved for a given set of states. The image is the reflection of the states as provided by the mirror (transition/relation operation). Imaging and/or preimaging techniques may be used in order to determine what is deep within target circuit 12.

In another example offered for purposes of teaching, it is assumed that line 1 and line 2 are states, whereby line 1 and line 2 are parallel and separated by a transition/relation element. In certain scenarios, the reflection of line 2 affects information associated with line 1. However, what is generally sought is everything reflected by either line 1 or line 2 exclusively. The image and preimage operations may be used in order to determine what is being received from each of the lines. By using the process of subtraction, it may be determined what is included in line 1 and line 2. What is left may be referred to as genuine objects, contenders, or choices that maintain their integrity. From this information, it can be determined what is causing confusion or errors and eliminate these elements from the process.

In another example, consider the case where set 1 includes states 1, 2 and 3. Further consider set two, which includes states 4 and 5. All of these elements may be reflected in states 10 and 11. In analyzing states 10 and 11, a reflection is provided that is coming from states 1, 2, 3, 4, and 5. It may be recognized that it is improper to consider 4 and 5 in an analysis associated with set 1 because these elements are associated with set 2. Thus, states 4 and 5 may be subtracted from the set whereby what is left is the genuine set from set 1 (states 1, 2, and 3). The distance between sets 1 and 2 can be identified as one unit. The difference between set 2 and set 0 is two units. A calculation may then be made, at a distance of one unit, between set 1 and set 0. In a next step, the analysis may shift to set −1 and the analysis may continue to set −2 and so forth. In this sense, the information is inductively being amassed such that the analysis continues to move back in order to generate greater distances and depth. This procedure allows verification of states deeper within target circuit 12.

In an example embodiment, "deeper" generally refers to a depth parameter associated with target circuit 12, which is being analyzed. Certain states may be reachable and other states may be incapable of being reached without performing preliminary tasks first. States generally have different depths because some fixed point calculations may terminate early and some others may extend far into a given test circuit. This may be based on the characteristics of a given function. The given function may be configured such that under some window or sub-spaces, the analysis may continue for an extended depth. Additionally, provenly deep states and a heuristical set of states may be present. The provenly deep states generally require a significant amount of work in order to determine if they are deep. A heuristical set of states generally provides no guarantee as to depth. Heuristical states may be provided (potentially quickly), however, it is unknown whether these states are deep. Thus, a balance is generally achieved between these two principles. Neither speed nor depth may be neglected in executing properly verification techniques. By using POBDD data structure 14, some states may be calculated that are potentially deep or certain states may be projected as usually deep and those states may be targeted for sampling.

Referring back to FIG. 2, BMC element 38 allows a small sampling or segment of a sub-space to be explored in association with a fixed point. Once the fixed point is reached, a fixed point calculation may be executed on another subspace. The random sampling may be executed on multiple sub-spaces, whereby the first set of states is effectively handed off by POBDD elements 34*a-c* to BMC element 38. After identifying the first set of states, it may be determined which sub-spaces have the greatest depth. For the sub-spaces that have the greatest depth, a particular set of states may be assumed to be the deepest set of states that are easily calculated. These states may be provided to BMC element 38 to take as an initial set of states in executing a deeper verification of a given circuit under test. BDD element 40 serves as the foundation or core protocol on which POBDD and BMC operations are predicated.

POBDD based BMC allows for the possibility of "Navigated Traversal" in choosing a direction to explore deeply.

System 10 may further allow for a controlled form of mixing Breadth First Search (BFS) with Depth First Search (DFS) because it may allow for reaching deep states (potentially selectively).

Appropriate time intervals may also be provided in conjunction with the sampling of multiple sub-spaces within a given circuit under test. A certain amount of time may be configured in order to evaluate various sub-spaces within a target. Once the time interval has expired, the process may stop and a determination may be made. The time interval may be based on expediency issues or practicality parameters associated with a given verification process. Where no deep states are found during the designated time interval, the program may be run in a difficult mode that includes a larger time out value. Alternatively, the manner in which the selection was executed may change such that any of the already sampled sub-spaces (or types of spaces) are not revisited. By giving a guarantee or a fixed proof that a deep state will be encountered, a significant gain in efficiency may be achieved with a minimal loss. This gain in efficiency may be disproportionately high as compared to the loss.

Formal verification of target circuit 12 may require that a reachability-based analysis be performed on target circuit 12 to determine which states are reachable from one or more initial states of target circuit 12, which may include constructing a set of transition relations (TRs) and conjuncting every member of the set. All primary inputs and present state variables of target circuit 12 may then be existentially quantified using the resulting formula. During the reachability-based analysis, one or more graphs may blow up, especially during conjunction. Because of problems associated with this type of blowup, BDD-based formal verification may at times be impractical. Formal verification may be limited in practical application to circuits that include approximately 100 or fewer latches or other circuit elements. However, many circuits include tens of thousands (or more) of circuit elements. POBDDs may be used to make BDD sizes smaller, but many POBDD techniques used to perform reachability-based analysis rely on splitting a circuit using cubes. A cube is an assignment on one or more input literals (which may be input variables or state space variables). A free BDD may also, according to certain interpretations, represent a cube-based partition, but a cube-based partition is provenly less efficient than partitions in which one or more windows is generated using arbitrary functions. In particular embodiments, to reduce time requirements associated with the reachability-based analysis and to make the analysis more space efficient, one or more arbitrary functions may be used as one or more windows. These BDDs may be called "multiply rooted BDDs," since each window may have a different root variable.

Particular embodiments identify splitting variables that are based on decomposition points. A decomposition point may represent one or more general functions (instead of cube-like assignments of primary variables) such that a partial assignment of the functions may also be a general function. One or more functions in which an initial computation and model may be expressed in terms of decomposition and composition may be processed. Two procedures may be used.

According to the first procedure, a BDD of each latch in the circuit is constructed. Decomposition points may be used to construct BDDs of TRs. A composition process may be used to construct a TR graph in terms of primary variables (which include input and state variables). To construct the TR graph, composition of decomposition point variables may be continued until a composition is generated that causes the TR graph to blow up. If no composition is generated that causes the TR graph to blow up, the final TR graph may be small and there may be no difficult composition. However, small TR graphs occur relatively infrequently. If no composition is generated that causes the TR graph to blow up, the final TR graph may be large and may have reached its size through a large number of compositions that each contribute a relatively small amount to the size of the TR graph. However, cumulative effect may lead to an explosion in the size of the TR graph. In this case, decomposition heuristics may be changed to create a smaller number of decomposition points. Since a large TR graph size increase may take place after a small number of compositions, there may be a better defined explosion in the TR graph size after each composition.

Two disjunctive partitions may be generated for the composition using one or more standard BDD techniques and, if each disjunction partition is below a predefined threshold, the partition may be the root of a noncube-based partitioning tree (NCPT). BDD size may be monitored by monitoring a number of new allocated nodes or according to another technique. This may reduce the need to measure the TR graph size by traversal after every atomic operation. If TR graph size is not below the predefined threshold, cube-based partitioning may be used to decrease the graph size.

For each leaf of the above-defined NCPT, the preceding two steps may be recursively carried until all decomposition points have been composed and all partitions are created. Using each partition of the TR a reachability analysis may be performed until a fixed point is reached. The partitioning described above may be introduced during conjunction-quantification during image computation. To communicate from a partition P_j to another partition P_k, one or more quantifications may be performed using a generalized cofactor of partition P_k. Quantifications within partition P_j may be similarly conducted using a space of a complement of P_j as a "don't care." This may be affected using a generalized cofactor operation.

According to the second procedure, a decomposition point from a decomposition set, d1, d2, . . . , d_k, is used to create windows that can reduce BDD size associated with other decomposition points. For each BDD, d1, d2, . . . , d_k, as well as a BDD of a TR, generalized cofactors with BDD d_j and a complement are taken. One or more suitable BDDs d_j are chosen from the decomposition set. A decomposition function d_j is taken that may reduce as many decomposition point BDDs as possible. Reduction capability may be measured in terms of balance and nonredundancy of produced BDDs, according to one or more techniques. According to both procedures, window creation is not limited to being carried out at only particular times during a reachability-based analysis. Window creation may be conducted during creation of a TR, as well as during application of one or more image or pre-image functions.

Previous partitioning schemes are typically based on the use of windows that are defined as minterm cubes on present state variables. A set of windows constructed in this fashion can be combined into a tree such that easy leaf of the tree represents one partition and each path along the tree represents a unique window. Such a partition BDD can be treated as a special case of free BDDs in which all subtrees rooted beyond a certain depth are disallowed from sharing variables. As the number of variable increases, this succinctness of free BDDs approaches that of regular ROBDDs in the asymptotic case. The non-deterministic succinctness afforded by the petitioned BDD data structure is effectively lost when cube-based partitioning is used. It is therefore possible that more compact representations may be generated by the use of non-cube windows for partitioning. It may be advantageous to analyze one or more problems associated with state-exploration and generate compact partitioned representations. This may require selection of good window functions. In particular embodiments, a partitioning approach is based on minterm cubes, i.e., each window can be thought of as the conjunction of literals. In addition, or as an alternative, in particular embodiments, a partitioning approach is based on generalized boolean functions.

In sequential verification, the complexity of the "composed" operator is cubic for ROBDDs and quadratic for partitioned BDDs. Therefore, an exponential gain may be obtained on multiple sequential nested compositions by the use of partitioning. There may be one or more advantages of partitioning in performing multiple composition operations. Defining partitioning in terms of composition points may provide one or more advantages because the construction of the transition relation for any given design, as well as the image computation, performs a sequence of nested functional compositions. Reachability analysis may typically be done by constructing a set of transition relations and in conjuncting every member of the set. Primary inputs and present state variables of the circuits may then be existentially quantified out from this formula. The graphs may blow up in size during this computation, especially during conjunction. Due to this blowup, BDD-based formal verification may be impractical for large-scale industrial designs. Often these procedures can be applied only on circuits with hundreds of latches. But industrial designs have tens of thousands of latches, often even more. POBDDs can be used to make BDD sizes much smaller. However, all the partitioning techniques rely on splitting the circuit using cubes (which may include assignments for set of literals, either input variables or state-space variables. A cube-based partition may also be interpreted as a special case of representation as a free BDD. However, free BDDs (and therefore such cube-based partitions) are known to be less compact than partitioning schemes where each window is generated using arbitrary functions. Hence, it may be preferable to use arbitrary functions as windows. BDDs generated in this manner are multiply rooted BDDs, since each windows may have a different root variable. This may make image computations (and therefore reachability analysis) faster and more space-efficient.

Splitting variables may be found that are based on decomposition points. Since decomposition points represent general functions (instead of cube-like assignments of primary variables), a partial assignment on such functions will also be a general function. It may be preferable therefore to process functions where the initial computation and model can be expressed in terms of decomposition and composition. In particular embodiments, BDDs of transition relations may be built as follows. Decomposition points may be used to build BDDs of transition relations. In a practical verification tool, for example, VIS, all BDDs may be built using decomposition points. The decomposition point variables may be composed until a composition blows up. Two disjunctive partitions may be created for the given composition using standard BDD techniques and, if each disjunction is lower than a predefined threshold, this partition may be used as the root of a non-cube based partitioning tree (NCPT). For each leaf of the NCPT, the previous two steps may be recursively executed until all the composition points have been composed and all partitions have been created. Using each partition of the transition relation, a reachability analysis may be performed until a fixed point is reached.

This partitioning may be introduced even when actual conjunction/quantification is being performed during image computation. This analysis procedure, in particular embodiments, may make use of the most compact form of POBDDs which are non-cube based, overlapping POBDDs. Since good results may be obtained even when using cube-based POBDDs, greater savings may be realized when this generalized form of the partition data structure is used. In addition, computations of the reachability analysis that can be written in terms of a sequence of composition operators may be examined. In the above procedures, composition-based generation of partitioning windows are used during the construction of transition relation. When image computation may be expressed as described above, the technique becomes a technique for dynamic repartitioning during image computation. For practical circuits, where BDDs can become very large, such potential for reducing memory usage may provide one or more advantage. Such multiply rooted data structures may provide exponential reduction in size over cube-based POBDDs in particular embodiments.

FIG. 3 illustrates an example method for reachabilty-based verification of a circuit (such as target circuit 12) using one or more multiply rooted binary decision diagrams. The method begins at step 100, where a POBDD is generated for a latch of target circuit 12. At step 102, a TR of the POBDD is graphed. At step 104, two disjunctive partitions of the POBDD are generated. At step 106, each disjunctive partition of the POBDD is compared with a threshold size. At step 108, if both disjunctive partitions of the POBDD are below the threshold size, the method proceeds to step 110. At step 110, the POBDD is assigned to the root of an NCPT. At step 112, for each leaf of the NCPT, all decomposition points are composed and all partitions are generated. At step 114, a reachability analysis is performed using each partition of each leaf of the NCPT until a fixed point is reached, at which point the method ends. Returing to step 108, if both disjunctive partitions of the POBDD are not below the threshold size, the method proceeds to step 116. At step 116, the TR is reduced using a cube-based partitioning technique, and the method resumes at step 110. The method illustrated in FIG. 3 may be repeated for multiple latches (perhaps even every latch) of target circuit 12. Although particular steps of the method illustrated in FIG. 3 are described and illustrated as occurring in a particular order, the present invention contemplates any suitable steps of the method described above occurring in any suitable order.

Although the present invention has been described in detail with reference to particular embodiments, system 10 may be extended to any scenario in which verification is sought for a given target that has been designed or manufactured to perform a selected task or to include a designated property. Moreover, significant flexibility is provided by system 10 in that any suitable one or more components may be replaced with other components that facilitate their operations. For example, although system 10 has been described with reference to particular components such as BMC tool element 20, POBDD data structure 14, and algorithm element 16, these elements may be provided in a single integral unit where appropriate or replaced with devices that effectuate their functions. POBDD data structure 14 may be used with any other suitable checking or simulation protocol in order to enhance the verification capabilities thereof. Additionally, designer information 24 may be communicated or otherwise offered to POBDD data structure 14 in any appropriate manner such that BMC tool element 20 is provided with enhanced starting points for executing bounded model checking.

In addition, although system 10 has been described with reference to one or more discreet components, additional intermediate components may be provided to system 10 in order to facilitate the processing operations thereof. For example, additional components may be used in the communication of information between BMC tool element 20 and POBDD data structure 14. The present invention enjoys considerable versatility in that these components may be capable of operating in conjunction with various intermediate processing elements, in any suitable fashion, that facilitate the verification procedure for a given target element or object.

Although the present invention has been described with several embodiments, sundry changes, substitutions, variations, alterations, and modifications may be suggested to one skilled in the art, and it is intended that the invention may encompass all such changes, substitutions, variations, alterations, and modifications falling within the spirit and scope of the appended claims. The present invention is not limited, in any way, by any statement in the specification that is not reflected in the appended claims.

What is claimed is:

1. A system for reachability-based verification of a circuit using one or more multiply rooted binary decision diagrams (BDDs), the system comprising:
   a partitioned ordered BDD (POBDD) module operable to generate a POBDD for one or more latches in the circuit;
   a transition relation (TR) module operable, for each POBDD, to:
      graph a TR associated with the POBDD that reflects a plurality of input and state variables for the POBDD;
      generate two disjunctive partitions of the POBDD;
      compare the two disjunctive partitions with a threshold;
      if the two disjunctive partitions are below the threshold, assign the POBDD to the root of a noncube-based partitioning tree (NCPT) that comprises a plurality of leaves; and
      for each leaf of the NCPT, compose one or more decomposition points and generate one or more partitions; and
   an analysis module operable:
      using each partition of the TR, to perform a reachability-based analysis until one or more fixed points are reached;
      to communicate a result of the reachability-based analysis for reachability-based verification of the circuit.

2. The system of claim 1, wherein, for each leaf of the NCPT, all decomposition points are composed and all partitions are generated.

3. The system of claim 1, wherein a POBDD is generated for every latch in the circuit.

4. The system of claim 1, wherein a TR is graphed by composing one or more decomposition points until the TR blows up.

5. The system of claim 1, wherein the threshold is a predefined threshold.

6. The system of claim 1, wherein a size of each of the two disjunctive partitions is compared with the threshold, the size of each of the two disjunctive partitions being determined according to a number of new allocated nodes.

7. The system of claim 1, wherein the TR module is further operable, if the two disjunctive partitions are not below the threshold, to use one or more cube-based partitioning techniques to reduce the POBDD.

8. The system of claim 1, wherein a first POBDD is operable to communicate with one or more other POBDDs using a generalized cofactor operation.

9. A method for reachability-based verification of a circuit using one or more multiply rooted binary decision diagrams (BDDs), the method comprising:
   generating a partitioned ordered BDD (POBDD) for one or more latches in the circuit;
   for each POBDD:
      graphing a transition relation (TR) associated with the POBDD that reflects a plurality of input and state variables for the POBDD;
      generating two disjunctive partitions of the POBDD;
      comparing the two disjunctive partitions with a threshold;
      if the two disjunctive partitions are below the threshold, assigning the POBDD to the root of a noncube-based partitioning tree (NCPT) that comprises a plurality of leaves; and
      for each leaf of the NCPT, composing one or more decomposition points and generating one or more partitions;
   using each partition of the TR, performing a reachability-based analysis until one or more fixed points are reached; and
   communicating a result of the reachability-based analysis for reachability-based verification of the circuit.

10. The method of claim 9, wherein, for each leaf of the NCPT, all decomposition points are composed and all partitions are generated.

11. The method of claim 9, wherein a POBDD is generated for every latch in the circuit.

12. The method of claim 9, wherein a TR is graphed by composing one or more decomposition points until the TR blows up.

13. The method of claim 9, wherein the threshold is a predefined threshold.

14. The method of claim 9, wherein a size of each of the two disjunctive partitions is compared with the threshold, the size of each of the two disjunctive partitions being determined according to a number of new allocated nodes.

15. The method of claim 9, further comprising, if the two disjunctive partitions are not below the threshold, using one or more cube-based partitioning techniques to reduce the POBDD.

16. The method of claim 9, wherein a first POBDD is operable to communicate with one or more other POBDDs using a generalized cofactor operation.

17. Logic for reachability-based verification of a circuit using one or more multiply rooted binary decision diagrams (BDDs), the logic encoded in media and when executed operable to:
   generate a partitioned ordered BDD (POBDD) for one or more latches in the circuit;
   for each POBDD:
      graph a transition relation (TR) associated with the POBDD that reflects a plurality of input and state variables for the POBDD;
      generate two disjunctive partitions of the POBDD;
      compare the two disjunctive partitions with a threshold;
      if the two disjunctive partitions are below the threshold, assign the POBDD to the root of a noncube-based partitioning tree (NCPT) that comprises a plurality of leaves; and
      for each leaf of the NCPT, compose one or more decomposition points and generate one or more partitions;

using each partition of the TR, perform a reachability-based analysis until one or more fixed points are reached; and communicate a result of the reachability-based analysis for reachability-based verification of the circuit.

18. The logic of claim 17, wherein, for each leaf of the NCPT, all decomposition points are composed and all partitions are generated.

19. The logic of claim 17, wherein a POBDD is generated for every latch in the circuit.

20. The logic of claim 17, wherein a TR is graphed by composing one or more decomposition points until the TR blows up.

21. The logic of claim 17, wherein the threshold is a predefined threshold.

22. The logic of claim 17, wherein a size of each of the two disjunctive partitions is compared with the threshold, the size of each of the two disjunctive partitions being determined according to a number of new allocated nodes.

23. The logic of claim 17, further operable, if the two disjunctive partitions are not below the threshold, to use one or more cube-based partitioning techniques to reduce the POBDD.

24. The logic of claim 17, wherein a first POBDD is operable to communicate with one or more other POBDDs using a generalized cofactor operation.

25. A system for reachability-based verification of a circuit using one or more multiply rooted binary decision diagrams (BDDs), the system comprising:

means for generating a partitioned ordered BDD (POBDD) for one or more latches in the circuit;

means for, for each POBDD:

graphing a transition relation (TR) associated with the POBDD that reflects a plurality of input and state variables for the POBDD;

generating two disjunctive partitions of the POBDD;

compare the two disjunctive partitions with a threshold;

if the two disjunctive partitions are below the threshold, assigning the POBDD to the root of a noncube-based partitioning tree (NCPT) that comprises a plurality of leaves; and for each leaf of the NCPT, composing one or more decomposition points and generating one or more partitions;

using each partition of the TR, perform a reachability-based analysis until one or more fixed points are reach; and communication a result of the reachability-based analysis for reachability-based verification of the circuit.

* * * * *

UNITED STATES PATENT AND TRADEMARK OFFICE
CERTIFICATE OF CORRECTION

PATENT NO. : 7,280,993 B2
APPLICATION NO. : 10/704518
DATED : October 9, 2007
INVENTOR(S) : Jawahar Jain It is certified that error appears in the above-identified patent and that said Letters Patent is hereby corrected as shown below:

Title Page, Right Column, item (57) Abstract, Line 14 of Abstract, after "generating one or more" delete "partitions z." and insert -- partitions. --.
Column 1, Line 67, delete "partitionsz." and insert -- partitions. --.

Column 6, Line 3, after "for" delete "f $\overset{\Omega}{\mathsf{X}}$ g" and insert -- f⊗g --.

Column 6, Line 3, after "where" delete " $\overset{\Omega}{\mathsf{X}}$ " and insert -- ⊗ --.

Column 7, Line 31, after "where," delete "(".
Column 9, Line 40, after "=" delete "max".
Column 10, Line 6, after "on" delete "f" and insert -- $f$ --.
Column 10, Line 6, after "partition and in" delete "f" and insert -- $f$ --.
Column 20, Line 23, delete "communication" and insert -- communicating --.

Signed and Sealed this

Twenty-first Day of April, 2009

JOHN DOLL
*Acting Director of the United States Patent and Trademark Office*